US008934052B2

(12) United States Patent
Luan

(10) Patent No.: US 8,934,052 B2
(45) Date of Patent: Jan. 13, 2015

(54) CAMERA MODULE INCLUDING AN IMAGE SENSOR AND A LATERALLY ADJACENT SURFACE MOUNT DEVICE COUPLED AT A LOWER SURFACE OF A DIELECTRIC MATERIAL LAYER

(75) Inventor: Jing-En Luan, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 516 days.

(21) Appl. No.: 12/938,235

(22) Filed: Nov. 2, 2010

(65) Prior Publication Data
US 2012/0105713 A1    May 3, 2012

(51) Int. Cl.
*H04N 5/225* (2006.01)
*H01L 31/0232* (2014.01)
*H01L 27/146* (2006.01)

(52) U.S. Cl.
CPC ......... *H04N 5/2257* (2013.01); *H04N 5/2251* (2013.01); *H01L 31/02325* (2013.01); *H01L 27/14618* (2013.01)
USPC ........................................... 348/374

(58) Field of Classification Search
USPC ........................................... 348/374
See application file for complete search history.

(56) References Cited

U.S. PATENT DOCUMENTS

| 6,795,120 | B2* | 9/2004 | Takagi et al. ............... 348/294 |
| 7,112,863 | B2* | 9/2006 | Imaoka ...................... 257/432 |
| 7,227,236 | B1* | 6/2007 | Lee et al. ................... 257/433 |
| 2004/0027477 | A1* | 2/2004 | Tamura et al. ............. 348/340 |
| 2005/0046003 | A1* | 3/2005 | Tsai .......................... 257/686 |
| 2007/0194419 | A1* | 8/2007 | Ozawa ...................... 257/678 |
| 2008/0121890 | A1* | 5/2008 | Yang et al. ................. 257/66 |
| 2008/0261346 | A1* | 10/2008 | Yang et al. ................. 438/65 |
| 2009/0128681 | A1* | 5/2009 | Kim ........................... 348/335 |
| 2009/0262226 | A1* | 10/2009 | Lee et al. ................... 348/294 |
| 2010/0155946 | A1* | 6/2010 | Lee ........................... 257/738 |
| 2012/0286400 | A1* | 11/2012 | Camacho et al. ......... 257/621 |

OTHER PUBLICATIONS

So, et al.; "Benzocyclobutene-based polymers for microelectronics"; Dec. 2001; Chemical Innovation; vol. 31, No. 12; pp. 40-47.*

* cited by examiner

*Primary Examiner* — Gary C Vieaux
(74) *Attorney, Agent, or Firm* — Allen, Dyer, Doppelt, Milbrath & Gilchrist, P.A.

(57) ABSTRACT

A low profile chip scale module and method of making of the same. The low profile chip scale module includes embedded SMD and integrated EM shielding. An adhesive layer is arranged on a substrate, e.g., chip carrier. Dies and SMDs are arranged on the adhesive layer. An etched frame and molding is attached to the substrate. Inputs/outputs (I/O) are formed and the substrate is coated with a dielectric material. Metal lines and connections among bond pads are formed and another layer of dielectric material is applied as a protective layer. The substrate is cut into various predetermined sizes and a lens is attached to form the chip scale module.

13 Claims, 6 Drawing Sheets

CAMERA MODULE INCLUDING AN IMAGE SENSOR AND A LATERALLY ADJACENT SURFACE MOUNT DEVICE COUPLED AT A LOWER SURFACE OF A DIELECTRIC MATERIAL LAYER

BACKGROUND OF THE INVENTION

1. Field of the Invention

The invention generally relates to chip scale module and methods for making the same, and more particularly to a chip scale module used in a camera module.

2. Discussion of the Related Art

Camera modules are currently being used in a variety of different mobile terminals, such as portable phones, smart phones, camera phones, personal digital assistants, laptops, and the like. FIG. 1 is a related art camera module. Referring to FIG. 1, the related camera module is generally depicted as reference number 100. The camera module includes a lens module 102, a substrate 104, a die 106, e.g., image sensor, a surface mount device (SMD) 108 and an IR glass 110. The lens module 102 includes a lens holder 112, lens barrel 114, and lens 116. The image sensor may include a complementary metal oxide semiconductor (CMOS) image sensor, charged coupled device (CCD) image sensor or the like. The SMD 108 is directly coupled to the substrate 104 and bonding wires 118. As demand for high quality images increases, the damage for larger dies also increases. At the same time the demand for smaller mobile terminals is also increasing. However, the related art has some limitations due to the space required for wire bonding and places to arrange the SMD as the die increases in size. For example, as the die size increases there is no space for wire bonding or SMDs.

SUMMARY OF THE INVENTION

Accordingly, the invention is directed to a low profile chip scale module and method of producing the same that substantially obviates one or more of the problems due to limitations and disadvantages of the related art.

An advantage of the invention is to provide a compact camera module without a bonding wire, thereby, the die size is close to module size.

Another advantage of the invention is to provide a camera module having a die with dimensions ranging from about 1×1 mm to about 14×14 mm.

Still yet another advantage of the invention is to provide a camera module having dimensions ranging from about 2×2 mm to about 15×15 mm.

Yet another advantage of the invention is to provide a camera module having a conductive material coupling the SMD and die integrated into a dielectric material, thereby, significantly reducing the overall dimension of the camera module and also permitting the use of large dies, e.g., dies having dimensions ranging from about 1×1 mm to about 14×14 mm.

Still yet another advantage of the invention is to provide a camera module having SMDs embedded with the die, e.g., on the same layer/plane as the die.

Yet another advantage of the invention is to provide a camera module with system integration capability, it can have multi-dice, like sensor, processor to integrate within the camera module.

Yet another advantage of the invention is to provide a camera module with integrated electromagnetic (EM) shielding.

Additional features and advantages of the invention are set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the invention includes a camera module including a substrate and an image sensor and surface mount device (SMD) arranged on the substrate. A dielectric material substantially covers the SMD and image sensor. There is an opening on the dielectric to expose a sensor area of the image sensor. A conductive material in the dielectric material couples the SMD and the image sensor. An IR glass assembly is coupled to the dielectric material and a lens assembly is coupled to the IR glass assembly.

In another aspect of the invention, the invention is directed towards a method of making a camera module including the steps of providing a substrate and an adhesive layer on the substrate. At least one die and surface mount device (SMD) are arranged on the adhesive layer. A conductive frame also is arranged on the substrate. A molding is applied to the frame with a compressive molding material. A portion of the frame is removed to form an input/output pattern. A first dielectric material is formed on the input/output pattern and the adhesive layer is released from the substrate. Processing is now performed opposite the structure and includes forming a second dielectric material to substantially cover the die and the SMD. A conductive material is formed on the dielectric material electrically coupling the SMD, die and portion of the frame. A third dielectric material is formed to substantially cover the die, SMD and conductive material. In another embodiment of the invention, the camera module is utilized in a mobile device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
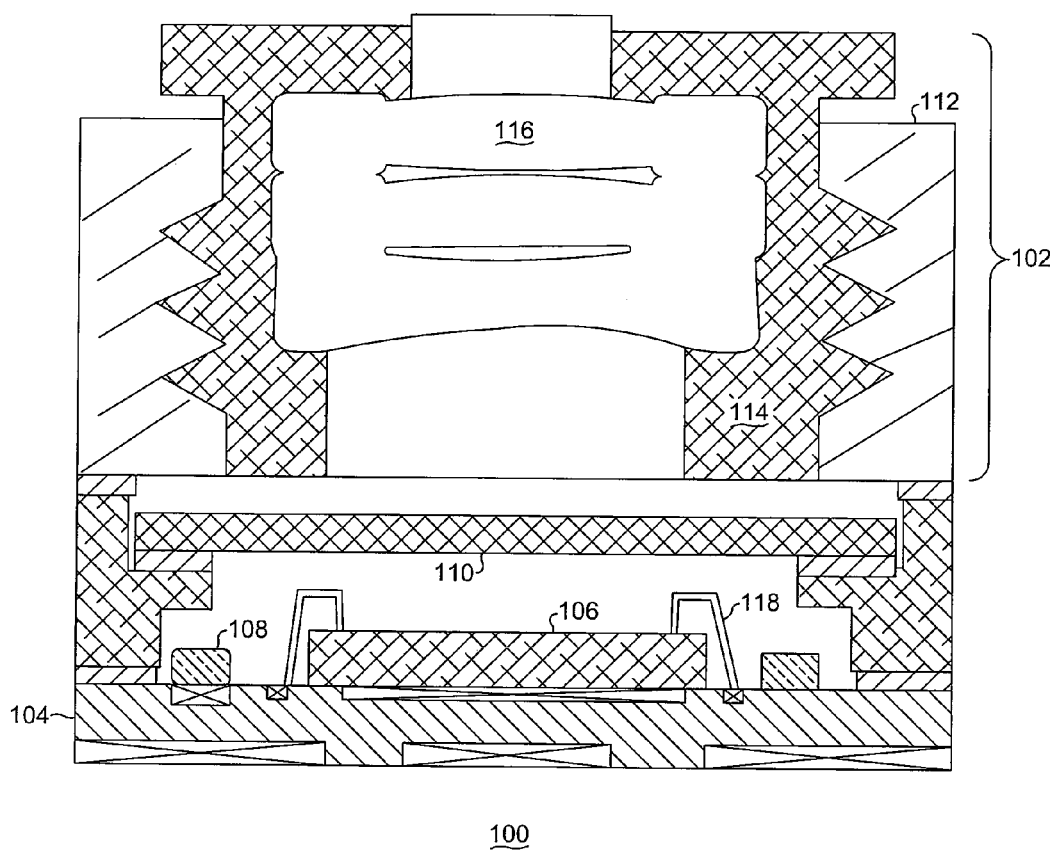
FIG. 1 is schematic, cross-sectional view of a camera module, according to the related art.

The invention generally relates to low profile chip scale module and methods for making the same, and more particularly to a packaging method and to a low profile chip scale module. The chip scale module may be used in a camera module and has significant advantages. The chip scale module includes embedded SMDs and EM shielding and is small, e.g., about 2×2 mm to about 15×15 mm. The camera module is configurable to hold dies in a range of about 1×1 mm to about 14×14 mm. The camera module may have a dimension of about 2×2 mm to about 15×15 mm.

In an embodiment of the invention, the camera module includes a die and surface mount device (SMD) arranged on the substrate. A conductive frame or material is arranged under the die and SMD. The conductive frame includes a conductive material such as copper, steel, alloys and the like. The die may be any type of desired die as known in the art. In a preferred embodiment, the die includes an image sensor, e.g., a complementary metal oxide semiconductor (CMOS) image sensor, charged coupled device (CCD) image sensor or the like. The SMD may include capacitors, resistors, conductors and the like.

A dielectric material covers the SMD, die and portion of the conductive material. The dielectric material may include epoxy novolacs with rubber filler, such as WPR-5100 series from JSR micro materials innovation, polyimide, bisbenzocyclobutene (BCB) and the like. An opening is formed in the dielectric material to expose an operational area of the die, e.g., sensor area of the image sensor. A conductive material is embedded in the dielectric material and is configured to couple the SMD, die, and conductive material. A protective dielectric material protects the conductive material.

An IR glass assembly is coupled to the protective dielectric material, and a lens assembly is coupled to the IR glass assembly with adhesive materials. The adhesive materials may include, e.g., epoxy such as Ablebond 8378B, epoxy by Henkel, Ablebond 2030, Loctite 3200 and the like. The lens assembly and lens assembly may be an integral unit. The IR glass assembly includes a lens holder, lens barrel, and lens. The lens may be a plastic lens, a glass lens and the like. The lens is adjustable up and down via the lens barrel.

The IR glass assembly includes an IR glass shelf configured to hold an IR glass. The IR glass is attached to the lens nook with an adhesive material. The lens assembly is attached to the chip sensor unit with an adhesive material. The lens assembly is attached to the IR glass assembly with an adhesive material.

Another embodiment of the invention is directed towards a method of making a chip scale unit. The method includes providing a substrate, e.g., carrier, and attaching an adhesive layer to the substrate. The adhesive layer may be a thermal adhesive configured to release at a certain temperature, e.g., thermal release tape such as REVALPHA, thermal release tape from Nitto Denko. A plurality of dies and surface mount devices are also arranged on the adhesive layer. A conductive frame is arranged over the dies and surface mount devices. The conductive frame may include copper, steel, alloys and the like. A molding material is applied to the frame, surface mount devices and dies to encapsulate the same. The molding material may include an epoxy molding, e.g., RH4212 epoxy molding compound from Nogase Corp. of Japan.

The conductive frame is patterned with techniques known in the art to form a predetermined input/output pattern. The adhesive layer is released by heating to a temperature of about 150° C. to about 200° C. The unit is flipped over for further processing on the reverse side. A second dielectric material is formed to substantially cover the dies and surface mount devices. A portion of the dielectric material is removed to expose a predetermined portion of the dies, e.g., by etching. A conductive material is formed on the dielectric material to electrically couple the dies, surface mount devices and frame. A third dielectric material is formed to substantially cover the die, SMD and conductive material. This third dielectric material is a protective layer. The chip scale sensor module is now complete. The first, second and third dielectric materials may be the same or different, e.g., they may include epoxy novolacs with rubber filler, such as WPR-5100 series from JSR micro materials innovation, polyimide, bisbenzocyclobutene (BCB) and the like.

A lens assembly and IR glass assembly are now attached to the chip scale sensor module to form a camera module. The lens assembly and IR glass assembly may be an integral unit. However, in this embodiment, the lens assembly includes a lens holder, a lens barrel and a lens. The lens barrel is configured to hold a lens and to adjust the focal length of the lens.

The IR glass assembly includes an IR glass shelf configured to hold an IR glass. The IR glass is attached to the lens shelf with an adhesive material. The lens assembly is attached to the chip sensor unit with an adhesive material, e.g., thermal release tape such as REVALPHA, thermal release tape from Nitto Denko. The lens assembly is attached to the IR glass assembly with an adhesive material. The lens assembly and the IR glass assembly may also be an integral unit, that is, there may be no need for the adhesive material as the structure is one integral piece.

Reference will now be made in detail to an embodiment of the present invention, an example of which is illustrated in the accompanying drawings.

Figure 2:
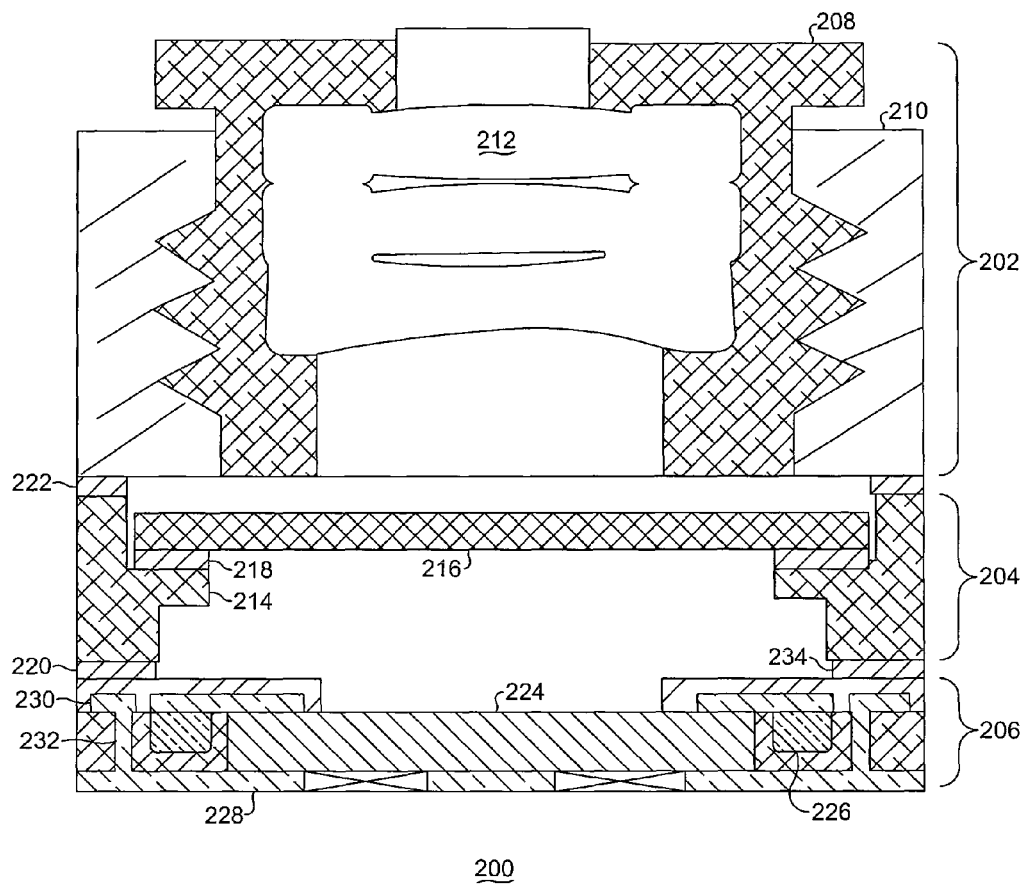
FIG. 2 is a schematic, cross-sectional view of a camera module according to an embodiment of the invention.

FIG. 2 is a schematic, cross-sectional view of a camera module according to an embodiment of the invention.

Referring to FIG. 2, a camera module is generally depicted as reference number 200. The camera module includes a lens assembly 202, IR glass assembly 204 and chip scale sensor unit 206. The lens assembly 202 includes lens holder 210, a lens barrel 208 and a lens 212. The lens barrel is configured to be adjustable such that the focal length of the lens 212 may change.

The IR glass assembly 204 includes an IR glass holding portion 214 configured to hold an IR glass 216. The IR glass 216 is attached to the holding portion 214 with an adhesive material 218. The IR glass assembly 204 is attached to the chip sensor unit 206 with an adhesive material 220, e.g., epoxy such as Ablebond 8378B, epoxy by Henkel, Ablebond 2030, Loctite 3200 and the like. The lens assembly 202 is attached to the IR glass assembly 204 with an adhesive material 222. The lens assembly 202 and the IR glass assembly 204 may also be on integral unit.

The chip sensor unit 206 includes a die 224 and at least one SMD 226. The die 224 and SMD 226 are coupled to an input/output array 228 (bottom conducting portion) with a patterned conductive material 230 (top conducting portion) and interconnect 232 (intermediate conducting portion connecting portions 228 and 230) embedded in a dielectric material 234.

FIGS. 3A-3K are schematic, cross-sectional views illustrating a process flow for forming a camera module.

Referring now to FIGS. 3A-3K, a thermally activated adhesive layer 302 is applied to a chip carrier 304. The thermally activated adhesive layer 302 is thermal release tape such as REVALPHA, thermal release tape from Nitto Denko. A SMD 306 is attached to the adhesive layer 302. A die 308 including a bond pad 310 is applied to the adhesive layer 302. As shown, a plurality of SMDs and a plurality of dies may be applied at predetermined locations on the adhesive layer.

Figure 3A:
FIGS. 3A-3L are schematic, cross-sectional views illustrating a process flow for forming a camera module according to another embodiment of the invention.
Figure 3B:
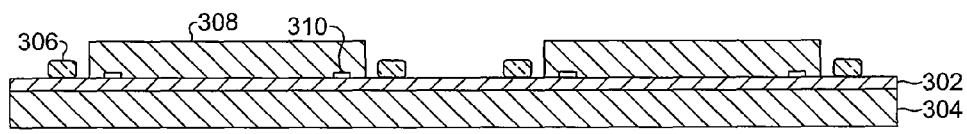
Figure 3C:
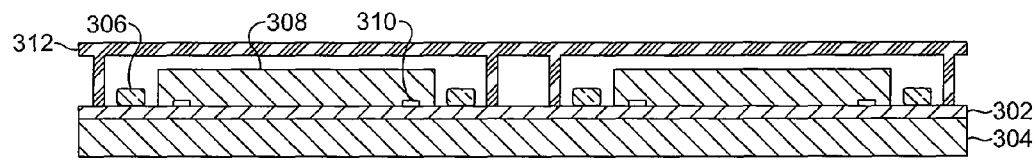
Figure 3D:
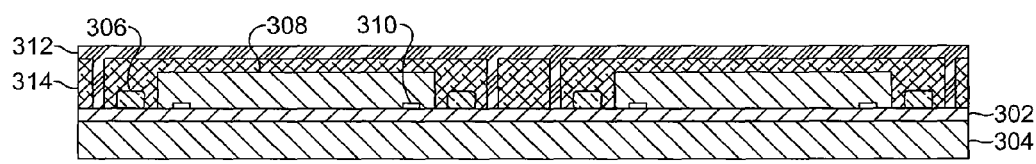
Figure 3E:
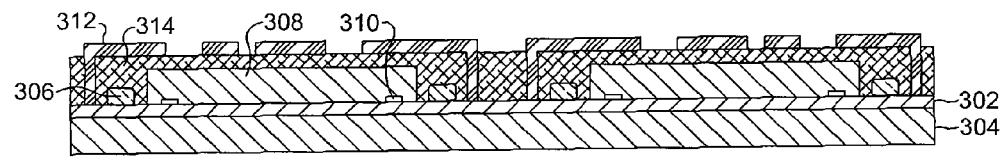
Figure 3F:
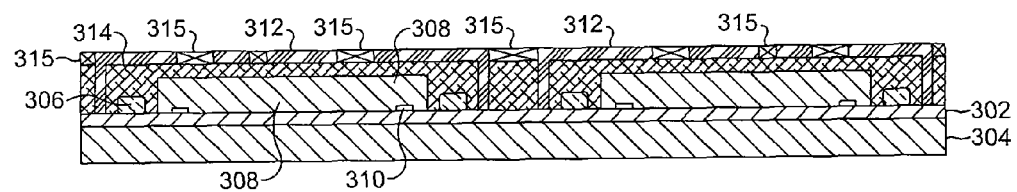
Figure 3G:
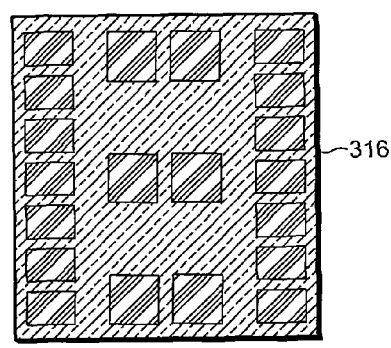

A frame 312 is placed on the adhesive layer to have configuration as shown in FIG. 3C. Molding 314 is then applied as shown in FIG. 3D. It is normally compression molding with liquid molding compound. The frame 312 is further etched with techniques as known in the art to form an input/output pattern 316 as shown in FIGS. 3E and 3G. A dielectric material 315 is then formed in the etched portions of the frame to form an input/output pattern 316 as shown in FIG. 3G. The adhesive layer 302 is now released and the overall structure flipped over for processing on the other surface.

Figure 3H:
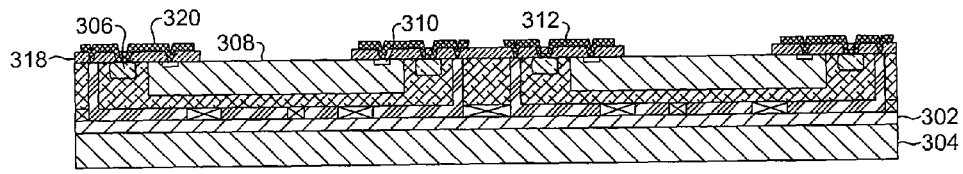

Referring now to FIG. 3H, a dielectric layer 318 is formed on the reverse surface of the structure, i.e., formed on the SMD 306 and die 308. An opening is formed in the dielectric layer to expose a portion of the die 308 and to form vias for connecting through the dielectric material to the frame 312, SMD 306 and bond pads 310 with techniques as known in the art. A conductive material 320 is then formed on the dielectric layer 318 to electrically couple the frame 312, SMD 306 and bond pad 310 as shown in FIG. 3H and with techniques as known in the art.

Figure 3I:
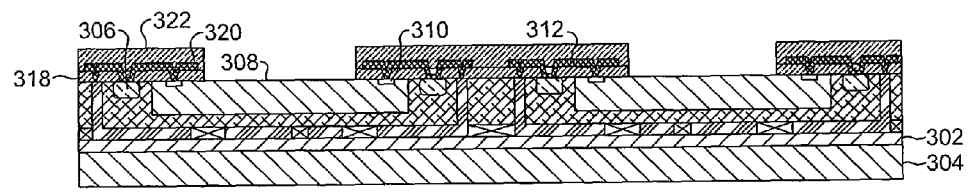
Figure 3J:
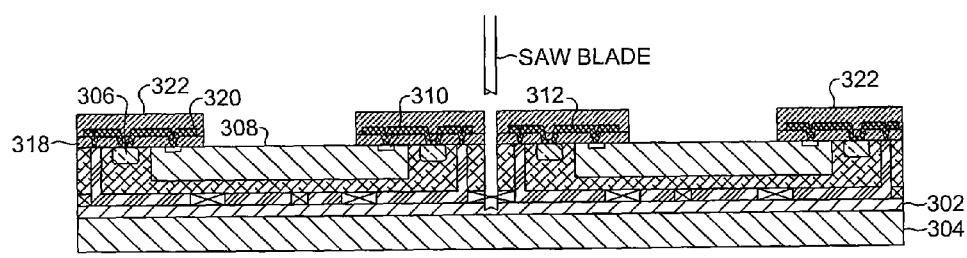
Figure 3K:
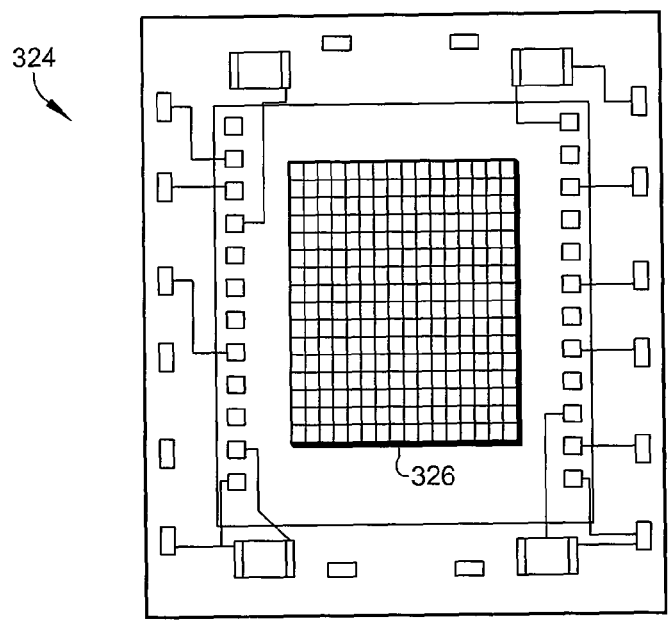
Figure 3L:
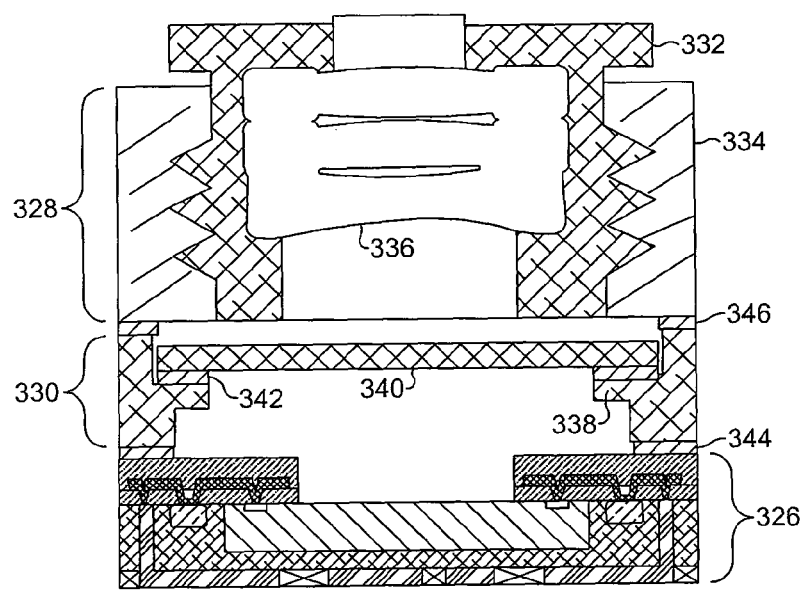

In FIG. 3I, a dielectric layer 322 is formed on the conductive layer 320 to protect the conductive layer. The conductive layer 320 is formed with techniques as known in the art. In FIG. 3J, the overall structure is divided into a plurality of units at predetermined portioned locations thereby forming an individual chip scale sensor unit 324 as shown in FIG. 3K. The chip scale sensor unit 324 includes a sensor area 326 of the die 308. The dividing may be conducted by techniques known in the art, e.g., cutting. Referring now to FIG. 3L, a lens assembly 328 and IR glass assembly 330 are attached to the chip scale sensor unit 324. The lens assembly 328 includes lens holder 334 and a lens barrel 332 configured to be adjustably coupled to the lens holder 334. The lens barrel 332 is configured to hold a lens 336.

The IR glass assembly 330 includes an IR glass shelf 338 configured to hold an IR glass 340. The IR glass 340 is attached to the lens shelf 338 with an adhesive material 342. The lens assembly 328 is attached to the chip sensor unit 326 with an adhesive material 344, e.g., epoxy. The lens assembly 328 is attached to the IR glass assembly 330 with an adhesive material 346. The lens assembly 328 and the IR glass assembly may also be an integral unit, that is, there may be no need for the adhesive material 346 as the structure is one integral piece.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A camera module, comprising, in a stacked arrangement:
    a body comprising a molding material;
    a device layer carried by the molding and comprising
        an image sensor on carried by the body at an upper surface thereof, and
        a surface mount device (SMD) carried by the body at the upper surface thereof and laterally adjacent and spaced apart from the image sensor;
    a dielectric material layer partially covering the image sensor and covering the SMD;
    a conductive material layer carried within the dielectric material layer and coupling an upper surface of the SMD to an upper surface of the image sensor at a lower surface of the dielectric material layer;
    an IR glass assembly carried by the dielectric material layer; and
    a lens assembly carried by the IR glass assembly.

2. The camera module of claim 1, wherein the image sensor comprises a complementary metal oxide semiconductor (CMOS) image sensor.

3. The camera module of claim 1, wherein the image sensor comprises a charged coupled device (CCD) image sensor.

4. The camera module of claim 1, wherein the SMD is selected from the group consisting of capacitors, resistors, inductors and combinations thereof.

5. The camera module of claim 1, wherein the image sensor has a dimension in a range from about 1×1 mm to about 14×14 mm.

6. The camera module of claim 1, wherein the camera module has a dimension in a range from about 2×2 mm to about 15×15 mm.

7. The camera module of claim 1, wherein the lens assembly comprises:
    a lens holder;
    a lens barrel coupled to the lens holder; and
    a lens carried by the lens barrel.

8. The camera module of claim 1, wherein the dielectric material comprises polyimide, bisbenzocyclobutene (BCB) or combinations thereof.

9. A mobile device comprising the camera module of claim 1.

10. The camera module of claim 1, further comprising a frame carrying the body.

11. The camera module of claim 10, wherein the frame has a u-shape.

12. The camera module of claim 10, wherein the frame extends through the body and is coupled to the conductive material layer.

13. The camera module of claim 10, wherein the frame has a plurality of input/output pads along a lower surface and coupled to the conductive material layer.

* * * * *

UNITED STATES PATENT AND TRADEMARK OFFICE
CERTIFICATE OF CORRECTION

| | | |
|---|---|---|
| PATENT NO. | : 8,934,052 B2 | Page 1 of 1 |
| APPLICATION NO. | : 12/938235 | |
| DATED | : January 13, 2015 | |
| INVENTOR(S) | : Luan | |

It is certified that error appears in the above-identified patent and that said Letters Patent is hereby corrected as shown below:

In the Claims

Column 5, Line 48      Delete: "on"

Signed and Sealed this
Eleventh Day of August, 2015

Michelle K. Lee
*Director of the United States Patent and Trademark Office*